United States Patent
Kinyua

(10) Patent No.: US 9,806,733 B1
(45) Date of Patent: *Oct. 31, 2017

(54) HYBRID ANALOG-TO-DIGITAL CONVERTER

(71) Applicant: Taiwan Semiconductor Manufacturing Co., Ltd., Hsin-Chu (TW)

(72) Inventor: Martin Kinyua, Cedar Park, TX (US)

(73) Assignee: Taiwan Semiconductor Manufacturing Co., Ld., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/339,200

(22) Filed: Oct. 31, 2016

Related U.S. Application Data

(63) Continuation of application No. 15/099,460, filed on Apr. 14, 2016, now Pat. No. 9,483,028.

(51) Int. Cl.
| | |
|---|---|
| H03M 1/06 | (2006.01) |
| H03M 1/12 | (2006.01) |
| G04F 10/00 | (2006.01) |
| H03M 1/10 | (2006.01) |
| H04N 5/378 | (2011.01) |

(52) U.S. Cl.
CPC ......... H03M 1/124 (2013.01); G04F 10/005 (2013.01); H03M 1/1023 (2013.01); H04N 5/378 (2013.01)

(58) Field of Classification Search
CPC ...... H03M 1/06; H03M 1/1023; H03M 1/203; H03M 1/207; H03M 1/124; H03M 1/46; H03M 1/00; H03M 1/12; H03M 2201/2291; G04F 10/005
USPC .......................................... 341/118, 155, 139
See application file for complete search history.

(56) References Cited

U.S. PATENT DOCUMENTS

| | | | |
|---|---|---|---|
| 7,301,775 B2* | 11/2007 | Isoda | H01L 23/50 257/E23.079 |
| 7,515,721 B2* | 4/2009 | Tashev | H04R 3/005 381/92 |
| 8,223,047 B2 | 7/2012 | Lai et al. | |
| 8,279,102 B2 | 10/2012 | Lai et al. | |
| 8,325,074 B2 | 12/2012 | Kinyua | |
| 8,476,971 B2 | 7/2013 | Peng et al. | |
| 8,493,259 B2 | 7/2013 | Lai et al. | |
| 8,547,259 B1 | 10/2013 | Huang et al. | |
| 8,599,057 B2 | 12/2013 | Lai et al. | |
| 8,618,975 B2 | 12/2013 | Nys | |
| 8,629,795 B2 | 1/2014 | Peng et al. | |
| 8,872,686 B2 | 10/2014 | Chou et al. | |
| 8,958,868 B2 | 2/2015 | Ghovanloo | |
| 9,013,341 B2 | 4/2015 | Soenen et al. | |

(Continued)

Primary Examiner — Jean B Jeanglaude
(74) Attorney, Agent, or Firm — Duane Morris LLP

(57) ABSTRACT

An analog-to-digital converter (ADC) circuit is configured to receive an analog input signal and convert the analog input signal to a digital output signal. The ADC circuit includes a first circuit that is configured to convert the analog input signal into a first digital signal that includes a first subset of bits of the digital output signal and further provide a residue signal based on the first digital signal; and a second circuit, coupled to the first circuit, and is configured to determine a discharging time duration by simultaneously amplifying and discharging the residue signal.

20 Claims, 9 Drawing Sheets

(56) References Cited

U.S. PATENT DOCUMENTS 9,197,240 B1 11/2015 Kinyua et al.
2014/0159932 A1 6/2014 Chang et al.

* cited by examiner

HYBRID ANALOG-TO-DIGITAL CONVERTER

CROSS-REFERENCE TO RELATED APPLICATION

This application is a continuation of U.S. patent application Ser. No. 15/099,460, filed Apr. 14, 2016, which is incorporated by reference herein in its entirety.

BACKGROUND

An analog-to-digital converter (ADC) is a device or circuit element that converts an analog signal to a digital data. For example, digital data can include a number of different digital codes, and each of the digital codes can correspond to a unique voltage or current level of the analog signal.

Advances in complimentary metal-oxide semiconductor (CMOS) technologies have dramatically improved the performance of systems which generally require an ADC as an interface. As the performance of such systems continues to improve, the performance of analog-to-digital conversion is becoming more important as analog-to-digital conversion is starting to become the system bottleneck in performance as well as power consumption. In addition to the concern of power consumption, some of the challenges in designing an ADC in such scaled CMOS technologies include, for example, a higher resolution, a higher sampling rate leading to a higher bandwidth, etc.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

Figure 1:
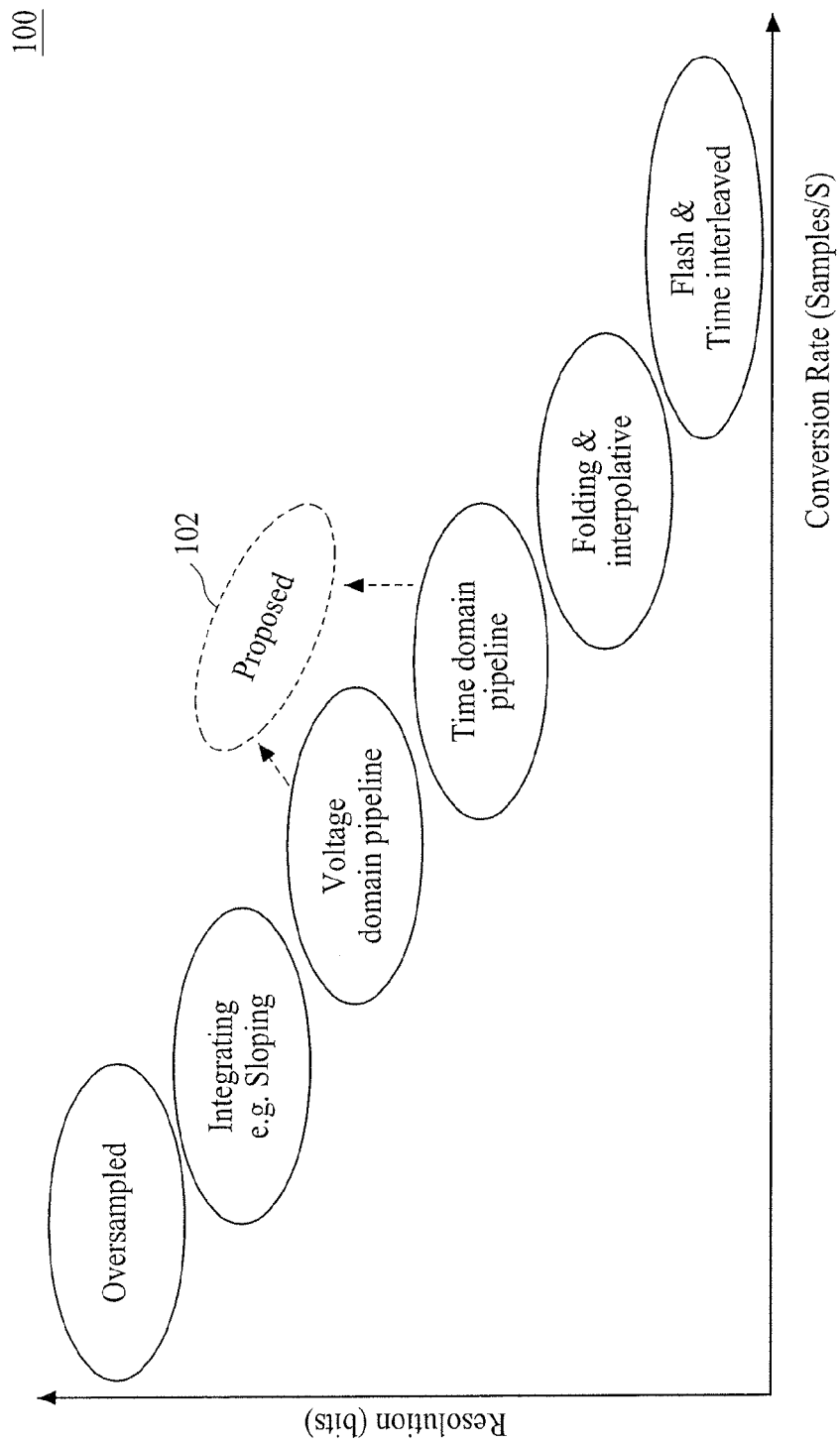
FIG. 1 illustrates an exemplary chart comparing performance characteristics of various types of analog-to-digital converters (ADCs) in accordance with some embodiments.

FIG. 1 illustrates a diagram 100 comparing some exemplary performance characteristics of various conventional analog-to-digital converters (ADCs) and a proposed hybrid ADC, in accordance with some embodiments. In the illustrated example of FIG. 1, the performance characteristics being compared includes a conversion rate (samples/second) as shown on the x-axis of diagram 100, and a resolution (bits) as shown on the y-axis of diagram 100 for each ADC. In general, a "resolution" of an ADC refers to a number of discrete values the ADC can provide over a range of an analog signal. Such values are stored in a binary form, and thus the resolution is generally expressed in "bits." For example, an ADC with a resolution of 2 bits is configured to convert an amplitude of an analog signal to one of 4 (since $2^2=4$) different levels. The term "conversion rate" generally refers to how fast an ADC can sample an analog signal or how many samples the ADC can provide during a certain period of time, which is expressed as "samples/second" or "Hz."

Referring still to FIG. 1, a plurality of conventional ADCs are compared to the proposed hybrid ADC 102. As shown in FIG. 1, the proposed hybrid ADC 102 is a hybrid between a voltage domain pipeline ADC and a time domain pipeline ADC, incorporating certain features of each, as discussed in further detail below, in accordance with some embodiments. In a non-limiting example, the plurality of conventional ADCs includes a flash ADC, a time-interleaving ADC, a folding ADC, an interpolating ADC, a time-domain pipelined (TDP) ADC, a voltage-domain pipelined ADC, an integrating ADC, and/or any of a variety of ADCs known in the art. It is known in the art (also shown in FIG. 1) that a trade-off between the resolution and the conversion rate of an ADC exists. That is, an ADC with a higher resolution (i.e., capable of producing more bits) is generally subjected to lower conversion rate (i.e., slower); and an ADC with faster conversion rate is generally subjected to a lower resolution. A non-limiting example may be better appreciated by comparing the voltage-domain pipelined ADC and the time-domain pipelined ADC, as shown in diagram 100 of FIG. 1. As indicated in FIG. 1, in accordance with some embodiments, the proposed hybrid ADC 102 has a higher resolution than the time-domain pipelined ADC while maintaining a faster conversion rate in comparison with the voltage-domain pipelined ADC.

Figure 2:
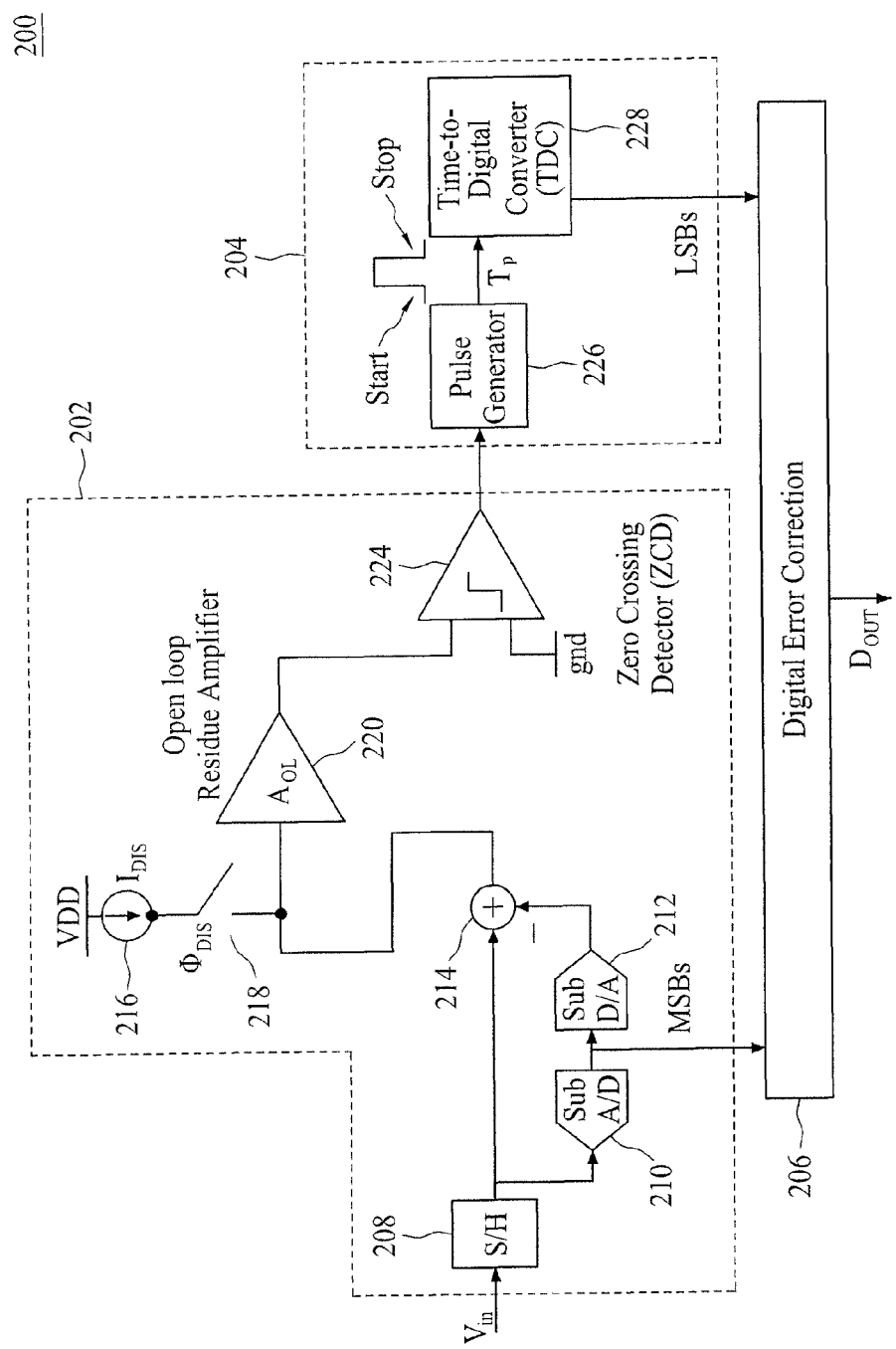
FIG. 2 illustrates an exemplary block diagram of a hybrid analog-to-digital converter (ADC) in accordance with some embodiments.

FIG. 2 illustrates an exemplary architecture of a hybrid ADC 200 in accordance with some embodiments. In the illustrated embodiment of FIG. 2, the hybrid ADC 200 includes a single stage that includes a first portion 202 and a second portion 204 connected to the first portion 202. The first portion 202 is configured to receive an input signal (e.g., $V_{in}$) and provide a discharging time duration "$T_{dis}$" to the second portion 204 that is coupled to the first portion 202. The operations of the first portion 202 and second portion 204 will be discussed in further detail below. Further, the hybrid ADC 200 includes a digital error correction circuit 206 that is coupled to the first portion 202 and the second portion 204 and is configured to receive one or more most significant bit signals (MSB's) of the input signal from the first portion 202 and one or more least significant bit signals (LSB's) of the input signal from the second portion 204. In one embodiment, the MSB signals comprise 3 bits and the LSB signals comprise 10 bits.

In addition to receiving the MSB(s) and LSB(s) from the first and second portions 202 and 204, respectively, the digital error correction circuit 206 may also receive one or more redundant bits from the first portion 202. In general, such a redundant bit may include a digital adder and/or a half adder and may be used by the digital error correction circuit 206 to correct an error, if any, induced by the sub ADC 210. For example, in order to increase a resolution of the sub ADC 210, one or more redundant bits may be first provided by the sub ADC 210 and then eliminated by the digital error correction circuit 206. As such, if there is any error (e.g., a comparator offset/nonlinearity) induced by the sub ADC 210, the one or more redundant bits may be used by the digital error correction circuit 206 to correct such error(s). In some embodiments, the redundant bit(s) may be included in the MSB(s). Still in accordance with some embodiments, the digital error correction circuit 206 is configured to provide a digital output "$D_{out}$" based on the received MSB(s) and the LSB(s), and such a digital output $D_{out}$ may include a number of bits that is a sum of bits of the received MSB(s) and LSB(s) data. In one exemplary embodiment, the MSB's, provided by the first portion 202 of the hybrid ADC 200, may have 2 bits and the LSB's, provided by the second portion 204 of the hybrid ADC 200, may have 10 bits so that the digital output $D_{out}$ may have 12 bits. In another example, the MSB's provided by the first portion 202 of the hybrid ADC 200 may have 3 bits (2 bits plus 1 redundant bit for error correction) and the LSBs provided by the second portion 204 of the hybrid ADC 200 may have 10 bits. As such, although the digital error correction circuit 206 receives 13 bits from the first and the second portions, the digital error correction circuit 206 may provide the digital output $D_{out}$ with 12 bits while using the redundant bit for correction.

In some alternative embodiments, the hybrid ADC 200 may include two stages or more. For example, the hybrid ADC 200 may include an additional stage and the additional stage may include a first portion and a second portion that are both coupled to the digital error correction circuit 206. More specifically, the first portion of such an additional stage ($2^{nd}$ stage) may be similar to the first portion 202 of the $1^{st}$ stage and/or the second portion of such an additional stage ($2^{nd}$ stage) may be similar to the second portion 204 of the $1^{st}$ stage. In some embodiments, the additional stage(s) may be configured to provide a higher resolution and/or sampling rate to the hybrid ADC 200.

Referring still to FIG. 2, the first portion 202 includes a sample and hold (S/H) circuit 208, a sub ADC circuit 210 coupled to the S/H block 208, a sub digital-to-analog converter (DAC) circuit 212 coupled to the sub ADC circuit 210, a subtraction circuit 214 coupled to the sub DAC circuit 212 and the S/H block 208, a current source 216, a discharging switch 218 coupled to the current source 216, an open loop residue amplifier (OLA) 220 coupled to the discharging switch 218 and the sub DAC circuit 212 through the subtraction circuit 214, and a zero crossing detector (ZCD) 224 coupled to the OLA 220.

In accordance with some embodiments, the S/H block 208 is configured to receive the input signal $V_{in}$, which is an analog signal in the voltage domain in accordance with various embodiments. Nevertheless, any of a variety of analog signals, for example, an analog signal in the current domain, may be received by the S/H block 208 while remaining within the scope of the present disclosure. In some embodiments, the S/H block 208 may be configured to sample (capture, or grab) a continuously varying analog signal (e.g., $V_{in}$) and hold a value of the analog signal at a constant level for a specific period of time. In some embodiments, the sub ADC circuit 210 is configured to provide MSB(s) of the input signal $V_{in}$ (i.e., a first portion of converted digital bits of the input signal $V_{in}$) to the digital error correction circuit 206. Generally, the sub DAC circuit 212, coupled to the sub ADC circuit 210, converts the digital signal (i.e., the MSB's) back to an analog signal. The subtraction circuit 214, coupled to both the sub DAC circuit 212 and the S/H block 208, is configured to provide a residue signal (i.e., a remaining portion of the input signal that has not been converted by the sub ADC circuit 210), which will be described in further detail below. The current source 216 is configured to provide a discharging path for the residue signal. The OLA 220 is configured to amplify the residue signal and the ZCD 224 coupled to the OLA 220 is configured to determine a discharging time duration associated with the (amplified) residue signal. The operation of the first portion 202 is described in further detail below with respect to FIGS. 3, 4, and 5, in accordance with various embodiments.

The second portion 204 includes a pulse generator 226 and a time-to-digital converter (TDC) 228. The pulse generator 226 receives the determined discharging time duration and is configured to generate a pulse signal (e.g., a time-domain signal $T_p$ having a pulse width that equals the determined discharging time duration). As will be discussed in further detail below, the TDC 228 is configured to use the time-domain signal $T_p$ from the pulse generator 226 to provide the LSB(s) of the input signal $V_{in}$ (i.e., a second/remaining portion of converted digital bits of the input signal $V_{in}$) to the digital error correction circuit 206. The operation of the second portion 204 is described in further detail below.

According to various embodiments, the disclosed hybrid ADC provides a variety of advantages over the conventional ADC(s). For example, in some embodiments, the hybrid ADC is capable of converting an analog signal to digital bits with a resolution of more than 12 bits using a single stage (in voltage domain) while not sacrificing the conversion speed of the hybrid ADC. That is, the trade-off between the resolution and conversion speed that is commonly seen in the conventional pipelined ADCs (e.g., voltage-domain pipelined ADC and/or time-domain pipelined ADC) may be eliminated by using the disclosed hybrid ADC. Additionally, with the increasing advance of submicron and/or deep submicron CMOS technologies, using a single stage (in voltage domain) in an ADC may also provide more favorable power consumption by the ADC.

Figure 3:
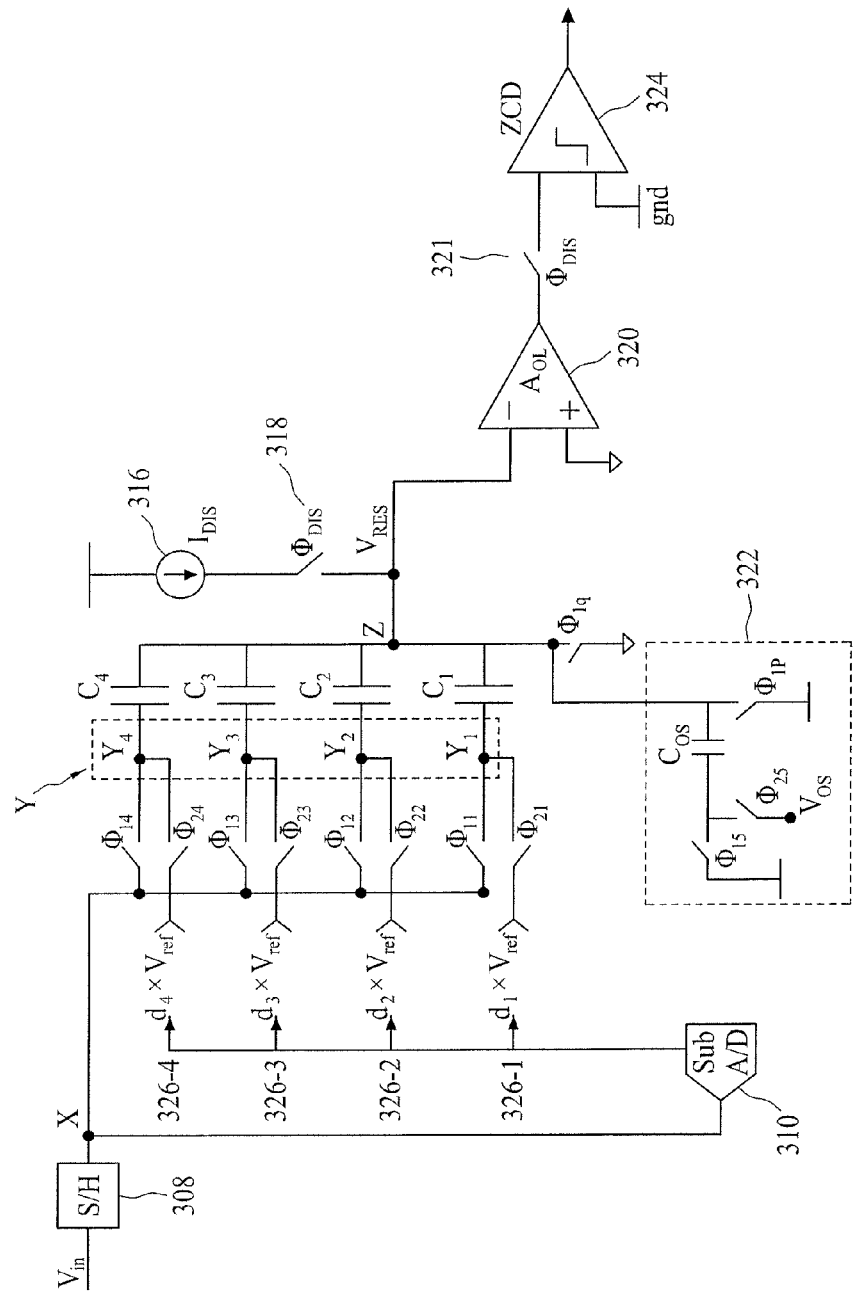
FIG. 3 illustrates an exemplary diagram of a first portion of the hybrid analog-to-digital converter (ADC) in FIG. 2 in accordance with some embodiments.

The above-discussed advantages of the hybrid ADC may be better appreciated by FIG. 3 illustrating an exemplary architecture of a first portion 202 of the hybrid ADC in accordance with various embodiments. For ease of discussion, the discussion with respect to FIG. 3 is provided in conjunction with FIGS. 4 and 5.

As illustrated in FIG. 3, the first portion 202 includes an S/H circuit 308, a sub ADC 310, a current source 316, discharging switches 318 and 321 ($\phi_{dis}$), an OLA 320, and a ZCD 324, which are similar or identical to corresponding circuits or devices shown in FIG. 2. In some embodiments, the current source 316, the discharging switches 318 and 321 ($\phi_{dis}$), the OLA 320, and the ZCD 324 may be implemented as an analog-to-time converter circuit, or a voltage-to-time converter circuit. In some embodiments, a first discharging switches $\phi_{dis}$ 318 is connected in series with the current source 316 and the second discharging switch $\phi_{dis}$ 321 is coupled between the OLA 320 and the ZCD 324. In the embodiment of FIG. 3, the first sub DAC 212 and the subtraction circuit 214 of FIG. 2 are implemented using a first plurality of switches $\phi_{11}$, $\phi_{12}$, $\phi_{13}$, and $\phi_{14}$, a second plurality of switches $\phi_{21}$, $\phi_{22}$, $\phi_{23}$, and $\phi_{24}$, sampling switch $\phi_{1q}$, and capacitors C1, C2, C3, and C4. A plurality of nodes of the first portion 202 of the hybrid ADC 200 are labeled as nodes 326-1, 326-2, 326-3, 326-4, "X", "$Y_1$", "$Y_2$", "$Y_3$", "$Y_4$", and "Z". In some embodiments, the first portion 202 further includes an offset circuit 322 that comprises switches $\phi_{15}$, $\phi_{25}$, $\phi_{1p}$, and a capacitor $C_{os}$.

In some embodiments, the nodes 326-1 to 326-4 are coupled to the sub ADC 210 and each of the nodes is configured to receive at least a digital bit from the sub ADC 310. For example, node 326-1 may receive digital bit "d1" from the sub ADC 310; node 326-2 may receive digital bit "d2" from the sub ADC 310; node 326-3 may receive digital bit "d3" from the sub ADC 310; node 326-4 may receive digital bit "d4" from the sub ADC 310. The digital bits d1 to d4 may constitute the MSB's of the input signal $V_{in}$ and the digital bits d1 to d4 may be provided to the digital error correction circuit 206 of FIG. 2. Although the illustrated embodiment of FIG. 3 only shows 4 digital bits, more or less digital bits may be provided by the sub ADC 310 while remaining within the scope of the present disclosure.

Referring still to FIG. 3, each of the first plurality of switches $\phi_{11}$, $\phi_{12}$, $\phi_{13}$, and $\phi_{14}$ is coupled between the node X (input signal $V_{in}$) and one of the respective nodes Y (e.g., $Y_1$, $Y_2$, $Y_3$, or $Y_4$); each of the second plurality of switches $\phi_{21}$, $\phi_{22}$, $\phi_{23}$, and $\phi_{24}$, is coupled between an associated node (e.g., 326-1, 326-2, 326-3, or 326-4) and one of the respective nodes Y; each of the capacitors C1, C2, C3, and C4 is coupled between one of the nodes Y and the node Z. For example, $\phi_{11}$ is coupled between the node X and the node $Y_1$, and capacitor $C_1$ is coupled between the node $Y_1$ and node Z; $\phi_{21}$ is coupled between the node 326-1 and the node $Y_1$. Similarly, $\phi_{12}$ is coupled between the node X and the node $Y_2$, and capacitor $C_2$ is coupled between the node $Y_2$ and node Z; $\phi_{22}$ is coupled between the node 326-2 and the node $Y_2$. $\phi_{13}$ is coupled between the node X and the node $Y_3$, and capacitor $C_3$ is coupled between the node $Y_3$ and node Z; $\phi_{23}$ is coupled between the node 326-3 and the node $Y_3$. $\phi_{14}$ is coupled between the node X and the node $Y_4$, and capacitor $C_4$ is coupled between the node $Y_4$ and node Z; $\phi_{24}$ is coupled between the node 326-4 and the node $Y_4$.

Regarding the offset circuit 322, the switch $\phi_{15}$ is coupled between ground and the capacitor $C_{os}$; the switch $\phi_{25}$ is coupled between the capacitor $C_{os}$ and a supply voltage $V_{os}$. In some embodiments, the first plurality of switches $\phi_{11}$, $\phi_{12}$, $\phi_{13}$, $\phi_{14}$, and $Y_{15}$ are identical and are simultaneously controlled by a same clock signal (e.g., signal 402 with respect to FIG. 4); the second plurality of switches $\phi_{21}$, $\phi_{22}$, $\phi_{23}$, $\phi_{24}$, and $\phi_{25}$ are identical and are simultaneously controlled by a same clock signal (e.g., signal 406 with respect to FIG. 4). However, in some alternative embodiments, each of the first and the second pluralities of switches may be different from each other and/or may be controlled by an individual clock signal. For the purpose of clarity, the first plurality of switches are identical and thus all referred to as "$\phi_1$" in the following discussion, and similarly, the second plurality of switches are identical and thus all referred to as "$\phi_2$" in the following discussion.

In some embodiments, the plurality of switches, including $\phi_1$, $\phi_{1p}$, $\phi_{1q}$, $\phi_2$, and $\phi_{dis}$, may include a transistor such as, for example, a metal-oxide-semiconductor field effect transistor (MOSFET), a bipolar junction transistor (BJT), a thyristor, and/or any of a variety of transistors known in the art.

Figure 4:
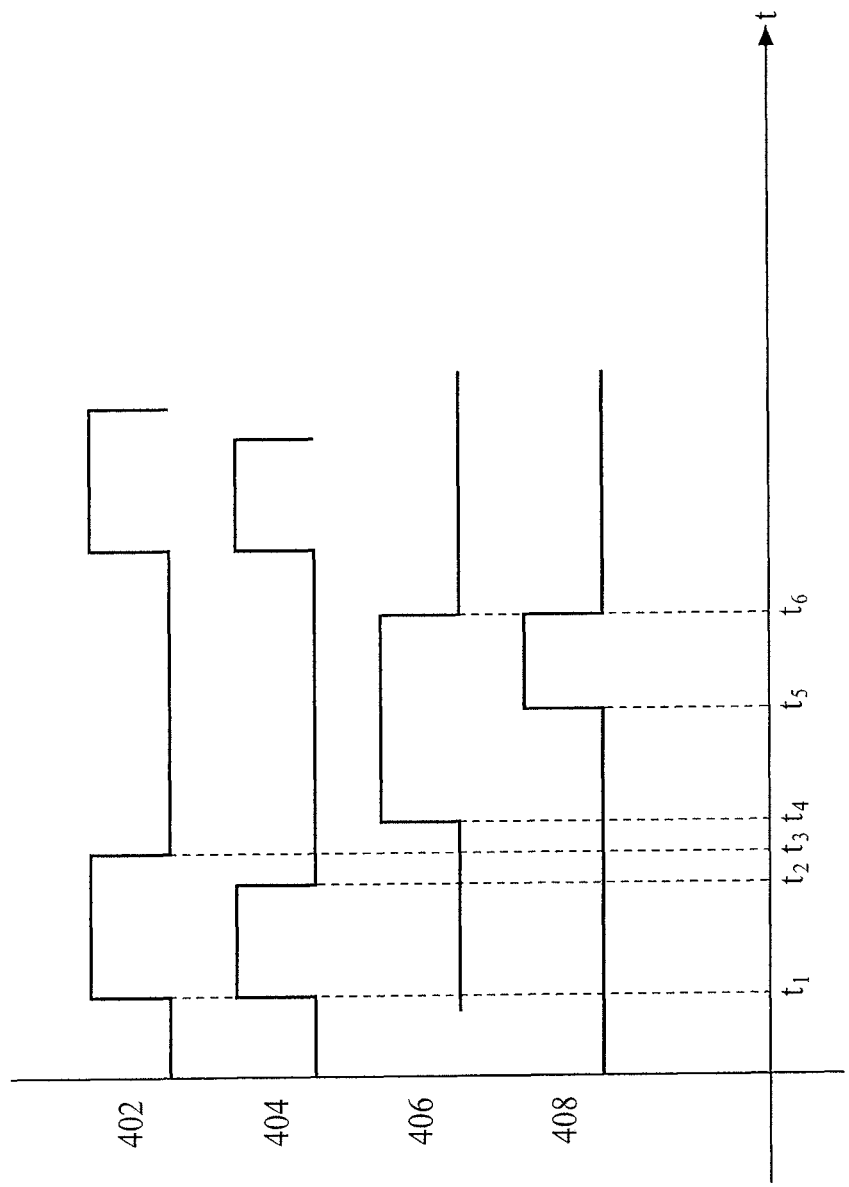
FIG. 4 illustrates exemplary signal waveforms to control a plurality of switches of the hybrid analog-to-digital converter (ADC) in FIG. 3 in accordance with some embodiments.

FIG. 4 illustrates waveforms of signals 402, 404, 406, and 408 to control the switches $\phi_1$, $\phi_{1p}$ and $\phi_{1q}$, $\phi_2$, and $\phi_{dis}$ respectively. In the following discussion, the switches $\phi_{1p}$ and $\phi_{1q}$ are controlled by a same signal (e.g., 406). Each of the signals is a signal that varies over time with a high state and a low state. Generally, when a signal transitions from a low state to a high state, it is referred to as a rising edge of the signal, which corresponds to an associated switch being turned on. And when a signal transitions from a high state to a low state, it is referred to as a falling edge of the signal, which corresponds to an associated switch being turned off. In some embodiments, a control signal is generated by a clock circuit such as an oscillator and/or any suitable circuit known in the art.

Figure 5:
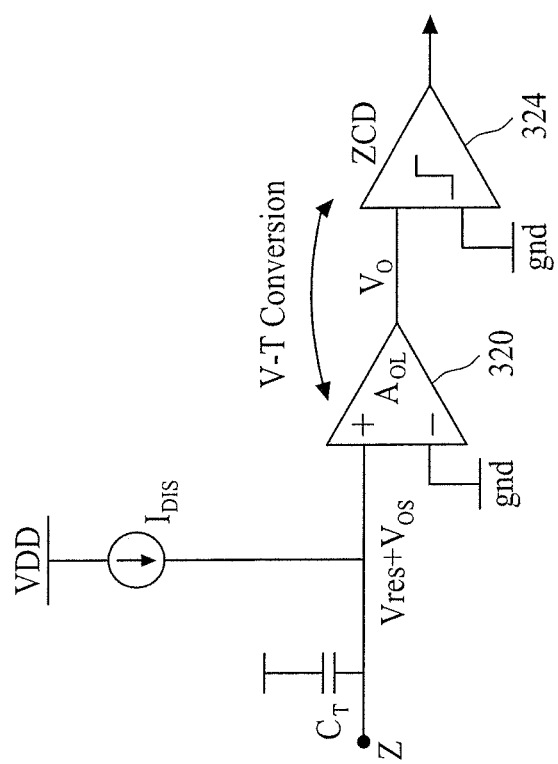
FIG. 5 illustrates an exemplary diagram of the first portion of the hybrid analog-to-digital converter (ADC) in FIG. 3 in accordance with some embodiments.

Referring now to FIGS. 3, 4, and 5 concurrently, operations of the hybrid ADC are discussed in accordance with some exemplary embodiments. In some embodiments, at time $t_1$, switches $\phi_1$, $\phi_{1p}$, and $\phi_{1q}$ are turned on. As such, the input signal $V_{in}$, at least in part, is first digitized into digital bits d1, d2, d3, and d4 by the sub ADC 310 and, as illustrated in FIG. 3, nodes $Y_1$, $Y_2$, $Y_3$, and $Y_4$ are now connected to the input signal $V_{in}$ through the S/H circuit 308. According to some embodiments, the digitized bits d1 to d4 may correspond to a first portion of the input signal $V_{in}$ in which the digital bits d1 to d4 constitute the MSB's of the input signal $V_{in}$. Referring back to FIG. 4, at time $t_2$, the switches $\phi_{1p}$ and $\phi_{1q}$ are turned off. At time $t_3$, the switches $\phi_1$ are turned off. According to some embodiments, $t_2$ is less than $t_3$ as to avoid charge coupling between the capacitors C1 to C4 via the switches $\phi_1$. During the time interval while the switches $\phi_1$ are turned on ($t_1$ to $t_3$), a voltage level at each of the nodes $Y_1$ to $Y_4$ may be around $V_{in}$. At time $t_4$, switches $\phi_2$ are turned on, and accordingly each of the nodes $Y_1$ to $Y_4$ is coupled to one of the nodes 326-1 to 326-4, as illustrated in FIG. 3: node 326-1 is coupled to node $Y_1$; node 326-2 is coupled to node $Y_2$; node 326-3 is coupled to node $Y_3$; and node 326-4 is coupled to node $Y_4$.

In some embodiments, since the switches 92 are turned on (starting from time $t_4$), a voltage level at each of the nodes $Y_1$ to $Y_4$ may transition from $V_{in}$ to around a reference voltage $V_{ref}$ times a corresponding digital bit (i.e., $V_{ref} \times di$, where i may be 1, 2, 3, or 4) through associated capacitors C1 to C4, thus generating a residue voltage $V_{res}$ at node Z, wherein $V_{res}$ constitutes the difference between $V_{in}$ and $V_{ref} \times di$. In particular, each of the capacitors C1 to C4 may serve as a subtractor that is configured to subtract the coupled reference voltage $V_{ref}$ times a digital bit (e.g., $V_{ref} \times d1$, $V_{ref} \times d2$, $V_{ref} \times d3$, or $V_{ref} \times d4$) from the input voltage $V_{in}$. Thus, the residue voltage $V_{res}$ is a remaining portion of the input signal $V_{in}$ that has not been digitized. The reference voltage $V_{ref}$ may be provided by a voltage source (not shown in FIG. 3 for the purpose of clarity). In some embodiments, the residue voltage is expressed as, $$V_{res} = \left( V_{in} - \sum_{i=1}^{i=4} C_i V_{ref} d_i / C_1 + C_2 + C_3 + C_4 \right).$$

In some embodiments, starting from time $t_4$, the voltage $V_{os}$ may be coupled through the capacitor $C_{os}$ to the residue voltage $V_{res}$ at node Z as an offset voltage. As such, the voltage at node Z may be expressed as, $V_{res}+V_{os}$. In accordance with some embodiments, adding $V_{os}$ to $V_{res}$ increases a width of a pulse output by the ZCD 324, which may otherwise be too small for purposes of accurate detection.

Referring still to FIG. 4, at time $t_5$, the discharging switches $\phi_{dis}$ 318 and 321 are turned on while the switches $\phi_2$ remain being turned on. Since the discharging switches $\phi_{dis}$ are turned on, a discharging path is provided through the current source 316 and an output voltage of the OLA 320 may change correspondingly. That is, from $t_5$, the voltage at node Z is being discharged (through the current source 316) and amplified (by the OLA 320) concurrently. As such, a bandwidth of the disclosed hybrid ADC is not limited by a frequency of a ramp signal and/or a frequency of a counter clock signal used as a reference signal to convert an analog signal to a group of digital bits that is each associated with time-domain information, which is commonly seen in conventional time-domain pipelined ADCs.

Referring now to FIG. 5, the output voltage ($V_o$) of the OLA 320 may be expressed as, $(V_{res}+V_{os}-I_{dis}T_{dis}/C_T) A_{ol}$, where $I_{dis}$ is a current level provided by the current source 316, $T_{dis}$ is a discharging time duration which may be later extracted by the ZCD 324, $C_T$ is an equivalent capacitance value at node Z, $A_{ol}$ is a gain of the OLA 320. The output voltage $V_o$ is then compared by the ZCD 324 to the ground (i.e., zero voltage). That is, the ZCD 324 detects when the output voltage $V_o$ equals zero, and once the output voltage $V_o$ equals/crosses zero, the switches $\phi_2$ and the discharging switches $\phi_{dis}$ are turned off (at time $t_6$) and the ZCD 324 is configured to provide the value of a discharge time duration ($T_{dis}$), based on the equation, $(V_{res}+V_{os})C_T/I_{dis}$ (when $V_o=0$). According to some embodiments, the value of $T_{dis}$ is independent from the gain ($A_{ol}$) of the OLA 320. As such, $T_{dis}$ linearly depends on the residue voltage $V_{res}$ and offset voltage $V_{os}$ and is thus substantially free of any of a variety of nonlinearity issues associated with OLA 320 that are common in the prior art.

Figure 6:
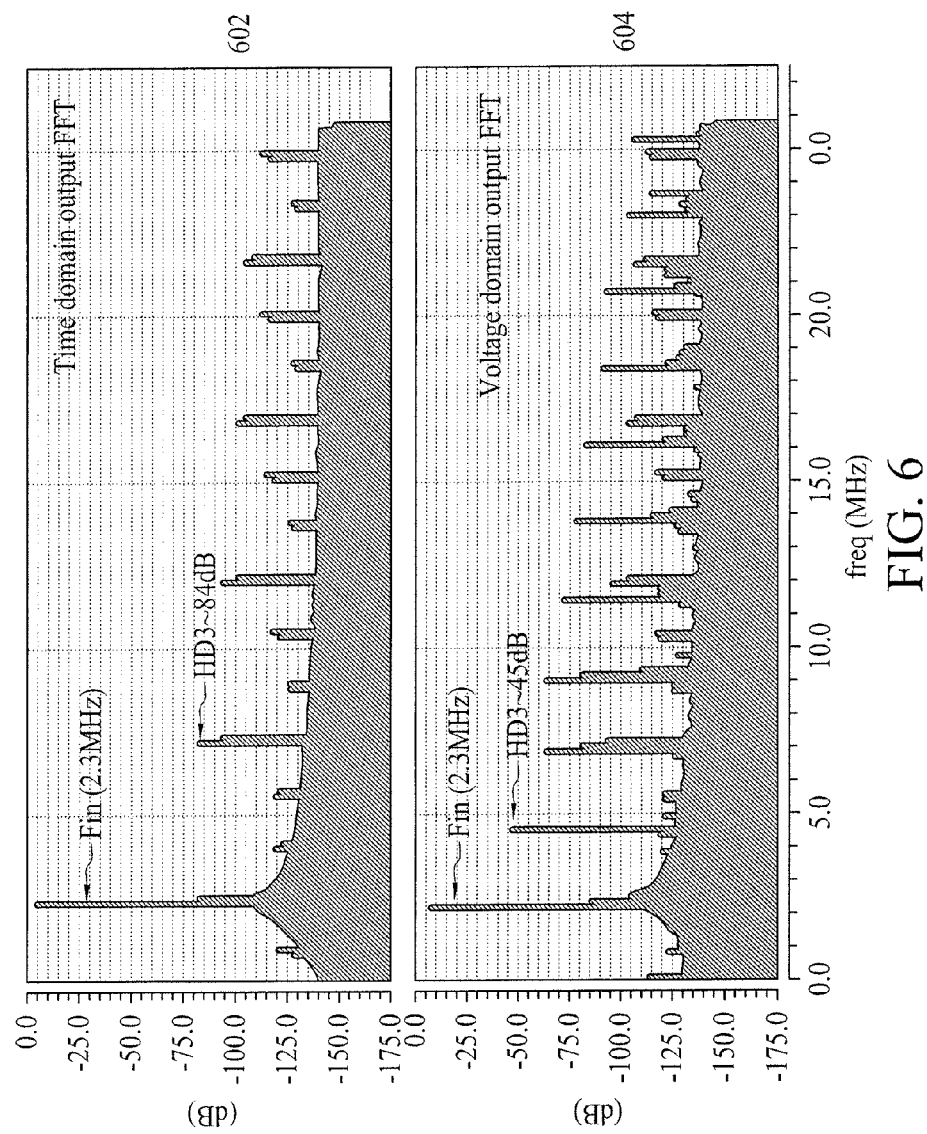
FIG. 6 illustrates Fast Fourier Transform (FFT) of signals at nodes of the hybrid analog-to-digital converter (ADC) in FIG. 3 in accordance with some embodiments.

The suppression of nonlinearity factors that may otherwise be associated with $T_{dis}$ is better appreciated when one considers the Fast Fourier Transform (FFT) of the signal $T_p$ (i.e., the time-domain signal used by the second portion 204 to provide LSBs of the input signal $V_{in}$), illustrated as signal 602 in FIG. 6 compared to the FFT of the voltage-domain signal $V_{res}$, illustrated as signal 604 in FIG. 6. As shown in FIG. 6, the dominant time-domain non-linearity in 602, represented by the third harmonic distortion (HD3), is approximately −84 dB while the equivalent voltage-domain (that is, the residue voltage representation at node Z before the discharging switches $\phi_{dis}$ are turned on) dominant nonlinearity in 604 is approximately −45 dB, thus providing a significant improvement in the overall conversion linearity. In the current embodiment, the time-domain pulse signal $T_p$ is associated with its time duration $T_{dis}$. That is, the pulse signal $T_p$ has a time-domain pulse width that equals the time duration $T_{dis}$. In general, without using such an OLA 320, conventional ADC uses a closed loop amplifier to amplify the residue signal. The closed loop amplifier requires a feedback loop. Thereafter, at least a nonlinear term may be introduced by the feedback loop to an amplified voltage (e.g., $V_o$). In stark contrast, by using the OLA 320 which requires no feedback loop, the amplified (output) voltage $V_o$ includes no nonlinearity factor (introduced by the amplifier) and thus the pulse signal $T_p$ having the duration $T_{dis}$, which is based on the output voltage $V_o$, has suppressed nonlinearity factors. As discussed above and shown in FIG. 6, the signal 604 (i.e., the FFT of the residue signal $V_{res}$ not processed by the OLA 320) shows less suppression of nonlinearity factors than the signal 602 (i.e., the FFT of the pulse signal $T_p$ that includes the duration $T_{dis}$ processed through the OLA 320). Thus, the non-linearity of the time-domain signal $T_p$ is much more suppressed than the voltage-domain signal $V_{res}$, which is one of various advantages provided by the OLA 320 in the current embodiment.

In some embodiments, the pulse signal $T_p$ with a time duration $T_{dis}$ is generated by the pulse generator 226. In this specific embodiment, the pulse generator 226 starts to generate a pulse signal when the discharging switches $\phi_{dis}$ are turned on (i.e., at time $t_5$) and at time $t_6$, once the ZCD 224/324 determines the value of $T_{dis}$, the pulse generator 226 provides a pulse signal $T_p$ with the duration of $T_{dis}$ to the TDC 228 and stops generating a pulse signal until it is later activated by another switching-on behavior of the discharging switch(es) $\phi_{dis}$.

In some alternative embodiments, compared to the above embodiment in which the pulse signal $T_p$ is generated by the pulse generator 226, the ZCD 324 is further configured to provide the time-domain pulse signal $T_p$ with a time duration $T_{dis}$ discussed above directly to the TDC 228 of the hybrid ADC 200. Referring back to FIG. 2, the TDC 228 may use the received signal $T_p$ to provide digital bit(s) that constitute the LSB(s) of the input signal $V_{in}$ to the digital error correction circuit 206. In some embodiments, the LSB(s) of the input signal $V_{in}$ may be provided by the TDC 228.

Figure 7:
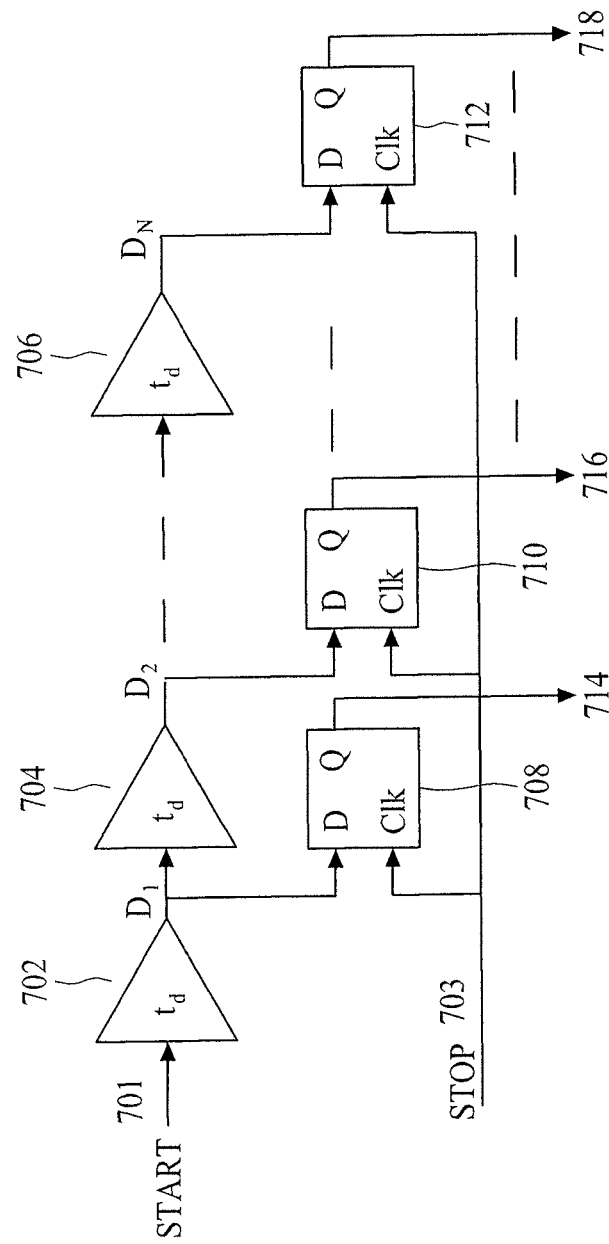
FIG. 7 illustrates an exemplary diagram of a time-to-digital converter (TDC) of the hybrid analog-to-digital converter (ADC) in FIG. 2 in accordance with some embodiments.

FIG. 7 illustrates an exemplary embodiment of the TDC 228. In the illustrated embodiment, the TDC 228 includes a digital delay-line based TDC that includes a chain of buffers (e.g., 702, 704, and up to 706) and another chain of flip-flops/comparators (708, 710, and up to 712) that are each connected to an output of one of the buffers, as shown in FIG. 7. More particularly, a start signal 701, provided by the ZCD 224/324 and/or the pulse generator 226, ripples along the chain of buffers, wherein each of the buffers is configured to provide a delay (e.g., $t_d$) to the start signal 701, thus generating a further delayed start signal at the output of each buffer. Each of the flip-flops is configured to sample a state of the delayed start signal on a rising edge of stop signal 703 (provided by the ZCD 224/324 and/or the pulse generator 226) and to provide, at least, a digital bit (e.g., 714, 716, and up to 718) to the digital error correction circuit 206. As discussed above, in some embodiments, such digital bit(s) provided by the TDC 228 may constitute the LSB(s) of the input signal $V_{in}$. Although the TDC 228 is implemented as a digital delay-line based TDC in FIG. 7, any of a variety of time-to-digital converters such as, for example, an inverter based TDC, a Vernier TDC, a TDC comprising voltage-controlled delay cells, a delay locked loop (DLL), etc., may be included in and/or implemented as the TDC 228 while remaining within the scope of the present disclosure.

Figure 8:
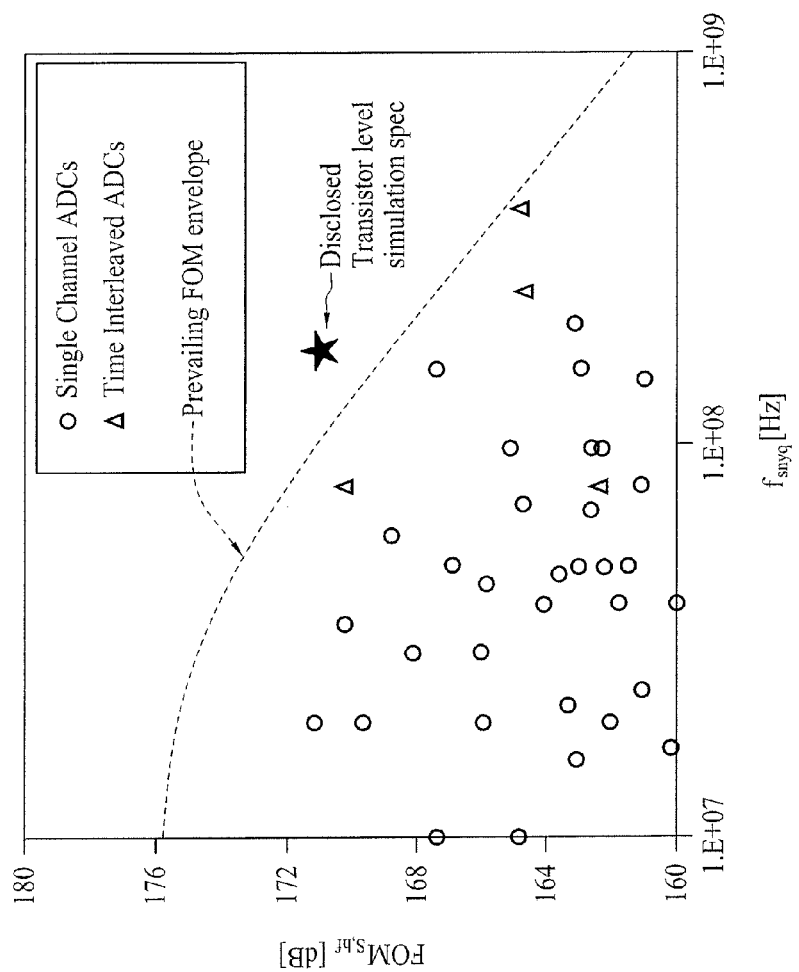
FIG. 8 illustrates an exemplary chart comparing Figure-of-Merit (FOM) of multiple analog-to-digital converters (ADCs) in accordance with some embodiments.

FIG. 8 is a chart illustrating figure of merits (FOMs) of the disclosed hybrid ADC and other conventional ADCs in accordance with various embodiments. Generally, a figure of merit of an ADC may be defined as, FOM (dB)=SNDR+ 10×log (BW/Power), where "SNDR" stands for the signal-to-noise and-distortion ratio of the ADC, "BW" stands for the bandwidth of the ADC, and "Power" stands for the power consumption of the ADC. As shown in FIG. 8, the x-axis of the chart is the Nyquist frequency of each ADC, the y-axis of the chart is the FOM of each ADC, the symbol "○" refers to a single channel ADC, the symbol "Δ" refers to a time-interleaved ADC, the dot line refers to the "prevailing FOM envelope," which means a hypothetical FOM threshold to which the conventional ADCs are limited. The star symbol illustrated is FIG. 8 represents the FOM of the disclosed hybrid ADC. In the illustrated embodiment of FIG. 8, the FOM of the disclosed hybrid ADC outperforms the prevailing FOM envelope, which means that the FOM of the disclosed hybrid ADC improved performance characteristics over conventional ADCs.

The table below shows various additional characteristics of the disclosed ADC, in accordance with some embodiments.

| Item | Spec |
| --- | --- |
| Technology | 40 nm LP |
| Architecture | MDAC + TDC |
| Supply [V] | 1.0 (Digital) |
| | 1.1 (Analog) |
| Fs [MS/s] | 200 |
| SNDR(LF) [dB] | 70.2 |
| SNDR(Nyq) [dB] | 69.0 |
| Total Power | 5 mW |
| Schreier FOM (LF) [dB] | 171.5 |
| Schreier FOM (Nyq) [dB] | 169.8 |

Figure 9:
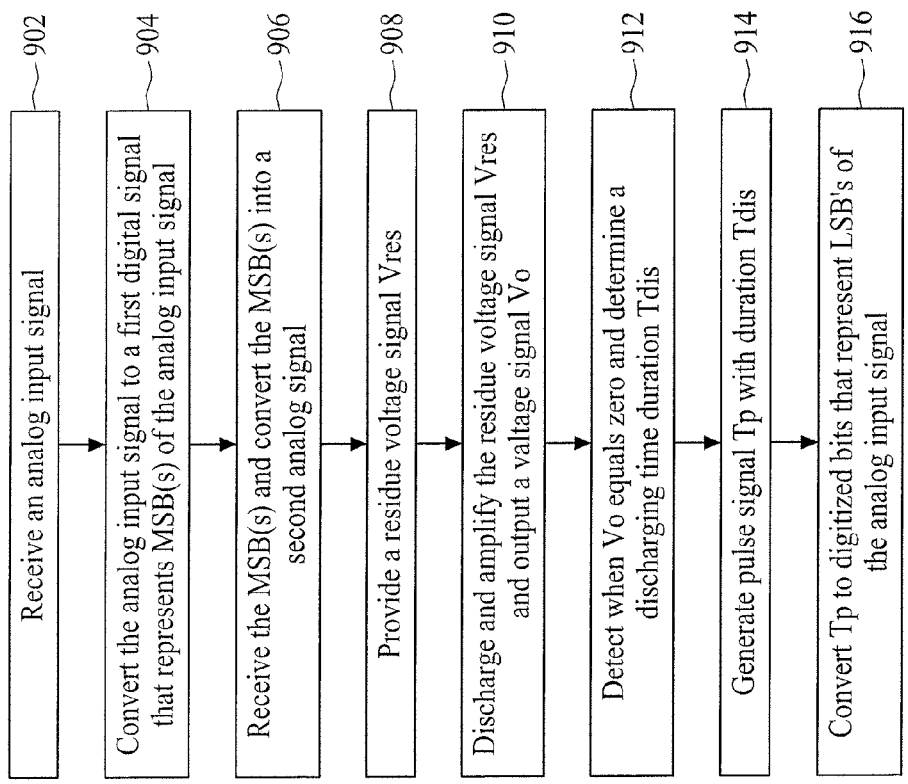
FIG. 9 illustrates a flow chart of a method to convert an analog input signal to a digital output signal by the hybrid analog-to-digital converter (ADC) of FIG. 2 in accordance with some embodiments.

FIG. 9 illustrates a flow chart of a method 900 to convert an analog input signal to a digital output signal in accordance with various embodiments. In various embodiments, the method 900 is performed by at least one of the components described in FIGS. 2, 3, and 5. For purposes of discussion, the following embodiment of the method 900 will be described in conjunction with FIGS. 2 and 3. The illustrated embodiment of the method 900 is merely an example so that any of a variety of operations may be omitted, re-sequenced, and/or added while remaining within the scope of the present disclosure.

The method 900 begins at operation 902 in which the sub ADC circuit 210 receives the analog input signal through the S/H block 208. In the specific embodiments discussed below, the analog input signal is a voltage-domain signal, hereinafter "$V_{in}$." In some embodiments, upon receiving the analog input signal $V_{in}$, the sub ADC circuit 210 converts the analog input signal $V_{in}$ into one or more digital bits (i.e., operation 904), wherein, as discussed above, such digital bits may constitute MSB's of the analog input signal $V_{in}$.

The method 900 proceeds to operation 906 in which the sub DAC 212 receives the digital bits and converts the digital bits back into a second analog signal. Next, at operation 908, the subtraction circuit 214 provides a residue voltage signal $V_{res}$ by subtracting the second analog signal from the analog input signal. In some embodiments, an offset voltage signal $V_{os}$ provided by the offset circuit 322 of FIG. 3, for example, may be added to the residue voltage signal $V_{res}$. Such added offset voltage signal $V_{os}$ may later be processed (or subtracted) by the Pulse Generator circuit 226 before the time pulse is coupled to the TDC 228.

The method 900 proceeds to operation 910 in which the current source 216 discharges the residue voltage signal $V_{res}$ through the discharging switch 218 while the open loop residue amplifier 220 simultaneously amplifies the $V_{res}$ signal. In some embodiments, the open loop residue amplifier 220 provides the output voltage signal $V_o$ to the ZCD 224 as discussed above and illustrated with respect to FIG. 5. Referring back to FIG. 9, the method 900 proceeds to operation 912 in which the ZCD 224 detects when the output voltage signal $V_o$ equals zero so as to determine the discharging time duration $T_{dis}$ and accordingly provides the determined discharging time duration $T_{dis}$ to the second portion 204.

The method 900 then proceeds to operation 914 in which the pulse generator 226 of the second portion 204 receives the discharging time duration $T_{dis}$ and generates the time-domain pulse signal $T_p$ with the discharging time duration $T_{dis}$. Then the method 900 continues to operation 916 in which the TDC 228 converts the pulse signal $T_p$ to provide one or more digital bits, wherein, as discussed above, such digital bits may constitute LSB's of the analog input signal $V_{in}$. In some specific embodiments, the conversion from the time-domain signal $T_p$ to the LSB's may be performed by the TDC 228. In some embodiments, the MSB's and LSB's are provided by the sub ADC circuit 210 and the TDC 228, respectively, to the digital error correction circuit 206 so that the digital error correction circuit 206 may provide the digital output signal based on the MSB's and LSB's.

In an embodiment, an analog-to-digital converter (ADC) circuit configured to receive an analog input signal and convert the analog input signal to a digital output signal is disclosed. The ADC circuit includes a first portion and a second portion. The first portion includes a sub ADC circuit that is configured to receive the analog input signal and convert the analog input signal into a first digital signal, wherein the first digital signal represents one or more most significant bits (MSB's) of the digital output signal; a sub digital-to-analog converter (DAC) circuit that is configured to receive and convert the first digital signal to provide a second analog signal; a subtraction circuit that is configured to subtract the second analog signal from the analog input signal to provide a residue signal; and an analog-to-time converter (ATC) circuit that is configured to determine a discharging time duration by simultaneously amplifying and discharging the residue signal. The second portion coupled to the first portion is configured to receive the discharging time duration and use the discharging time duration to provide a second digital signal that represents one or more least significant bits (LSB's) of the digital output signal.

In another embodiment, an analog-to-digital converter (ATC) circuit is disclosed. The ATC circuit includes a current source; a first amplifier coupled to the current source through a first discharging switch; and a second amplifier coupled to the first amplifier through a second discharging switch; wherein the first amplifier is configured to receive a residue signal of an analog input signal, upon the first discharging switch being turned on, the first amplifier amplifies the residue signal to generate an output signal and simultaneously the current source discharges the residue signal, upon the second discharging switch being turned on, the second amplifier detects when the output signal equals zero so as to determine a discharging time duration of the output signal.

Yet in another embodiment, a method to convert an analog input signal to an output digital signal by an analog-to-digital converter (ADC) circuit is disclosed. The method includes receiving the analog input signal; converting the analog input signal to a first digital signal that represents one or more most significant bits (MSB's) of the digital output signal; receiving the first digital signal and converting the first digital signal to provide a second analog signal; subtracting the second analog signal from the analog input signal to generate a residue signal; simultaneously discharging and amplifying the residue signal thereby providing an output signal; detecting when the output signal equals zero thereby determining a discharging time duration; generating a time-domain pulse signal having a pulse width equal to the determined discharging time duration; and converting the time-domain pulse signal to a second digital signal that represents one or more least significant bits (LSB's) of the digital output signal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter (ADC) circuit configured to receive an analog input signal and convert the analog input signal to a digital output signal, comprising:
    a first circuit that is configured to convert the analog input signal into a first digital signal that includes a first subset of bits of the digital output signal and further provide a residue signal based on the first digital signal; and
    a second circuit, coupled to the first circuit, and is configured to determine a discharging time duration by simultaneously amplifying and discharging the residue signal.

2. The circuit of claim 1, further comprising:
    a third circuit, coupled to the second circuit, and is configured to receive the discharging time duration and use the discharging time duration to provide a second digital signal that represents a second subset of bits of the digital output signal.

3. The circuit of claim 2, further comprising:
    a digital error correction that is coupled to the first, second, and third circuits and is configured to provide the digital output signal based on the first and the second digital signals.

4. The circuit of claim 2, wherein the third circuit comprises:
    a pulse generator that is configured to receive the discharging time duration and generate a pulse signal with the discharging time duration; and
    a time-to-digital converter (TDC) circuit, coupled to the pulse generator, is configured to use the discharging time duration to provide the second digital signal that represents the second subset of bits of the digital output signal.

5. The circuit of claim 2, wherein the first subset of bits represents one or more most significant bits (MSB's) of the digital output signal, and the second subset of bits represents one or more least significant bits (LSB's) of the digital output signal.

6. The circuit of claim 1, wherein the first circuit comprises:
    a sub ADC circuit that is configured to receive the analog input signal and convert the analog input signal into the first digital signal;
    a sub digital-to-analog converter (DAC) circuit that is configured to receive and convert the first digital signal to provide a second analog signal; and
    a subtraction circuit that is configured to subtract the second analog signal from the analog input signal to provide the residue signal.

7. The circuit of claim 1, wherein the second circuit comprises:
    a current source;
    an open loop amplifier coupled to the current source through a first discharging switch; and
    a zero crossing detector coupled to the open loop amplifier through a second discharging switch, wherein the first and the second discharging switches are controlled by a same control signal.

8. The circuit of claim 7, wherein in response to the first and the second discharging switches being turned on, the current source discharges the residue signal and the open loop amplifier amplifies the residue signal to provide an output signal to the zero crossing detector simultaneously.

9. The circuit of claim 8, wherein the zero crossing detector detects when the output signal equals zero so as to determine the discharging time duration.

10. The circuit of claim 1, wherein the analog input signal, and the residue signal are each in a voltage domain.

11. An analog-to-digital converter (ADC) circuit configured to receive an analog input signal and convert the analog input signal to a digital output signal, comprising:
    a first circuit that is configured to convert the analog input signal into a first digital signal that includes a first subset of bits of the digital output signal and further provide a residue signal based on the first digital signal;
    a second circuit, coupled to the first circuit, and is configured to determine a discharging time duration by simultaneously amplifying and discharging the residue signal; and
    a third circuit, coupled to the second circuit, and is configured to receive the discharging time duration and use the discharging time duration to provide a second digital signal that represents a second subset of bits of the digital output signal.

12. The circuit of claim 11, wherein the first subset of bits represents one or more most significant bits (MSB's) of the digital output signal, and the second subset of bits represents one or more least significant bits (LSB's) of the digital output signal.

13. The circuit of claim 11, further comprising:
    a digital error correction that is coupled to the first, second, and third circuits and is configured to provide the digital output signal based on the first and the second digital signals.

14. The circuit of claim 11, wherein the first circuit comprises:

a sub ADC circuit that is configured to receive the analog input signal and convert the analog input signal into the first digital signal;

a sub digital-to-analog converter (DAC) circuit that is configured to receive and convert the first digital signal to provide a second analog signal; and a subtraction circuit that is configured to subtract the second analog signal from the analog input signal to provide the residue signal.

15. The circuit of claim 14, further comprising:

an offset circuit coupled to the sub DAC circuit and is configured to add an offset signal to the residue signal.

16. The circuit of claim 11, wherein the second circuit comprises:

a current source;

an open loop amplifier coupled to the current source through a first discharging switch; and a zero crossing detector coupled to the open loop amplifier through a second discharging switch, wherein the first and the second discharging switches are controlled by a same control signal.

17. The circuit of claim 16, wherein in response to the first and the second discharging switches being turned on, the current source discharges the residue signal and the open loop amplifier amplifies the residue signal to provide an output signal to the zero crossing detector simultaneously.

18. The circuit of claim 17, wherein the zero crossing detector detects when the output signal equals zero so as to determine the discharging time duration.

19. The circuit of claim 11, wherein the third circuit comprises:

a pulse generator that is configured to receive the discharging time duration and generate a pulse signal with the discharging time duration; and a time-to-digital converter (TDC) circuit, coupled to the pulse generator, is configured to use the discharging time duration to provide the second digital signal that represents the second subset of bits of the digital output signal.

20. The circuit of claim 11, wherein the analog input signal, and the residue signal are each in a voltage domain.

* * * * *